(12) United States Patent  (10) Patent No.: US 8,058,932 B2
Liu et al.  (45) Date of Patent: Nov. 15, 2011

(54) DIGITAL PULSE WIDTH MODULATION DEVICE

(75) Inventors: Ta-I Liu, Taipei (TW); Chung-Chih Tung, Taipei (TW)

(73) Assignee: Ta-I Liu, Taipei (TW)

( * ) Notice: Subject to any disclaimer, the term of this patent is extended or adjusted under 35 U.S.C. 154(b) by 58 days.

(21) Appl. No.: 12/693,467

(22) Filed: Jan. 26, 2010

(65) Prior Publication Data

US 2011/0181369 A1 Jul. 28, 2011

(51) Int. Cl.
*H03L 7/00* (2006.01)

(52) U.S. Cl. ........... 331/16; 331/34; 331/177 R; 327/31; 327/37; 327/172; 327/175; 327/176; 327/178

(58) Field of Classification Search .................... 331/16, 331/34, 177 R; 327/172, 175, 31, 37, 176, 327/178
See application file for complete search history.

(56) References Cited

U.S. PATENT DOCUMENTS 7,362,152 B2 * 4/2008 Figoli .......................... 327/172

* cited by examiner

*Primary Examiner* — Arnold Kinkead
(74) *Attorney, Agent, or Firm* — Chun-Ming Shih

(57) ABSTRACT

A digital pulse width modulation device includes a counter, a first comparator and a second comparator, wherein the first and second comparators are connected in parallel with each other and in series with the counter. The counter is capable of sending a count signal to the first and second comparators simultaneously, starting a count when the counter receives a clock signal, and transmitting the count signal to the first and second comparators. If the first comparator receives a pulse duty width signal, the count of the count signal will generate a pulse output of the corresponding duty cycle. If the second comparator receives a total pulse duty length signal and the count of the count signal reaches a number of the total length, a clear signal will be outputted to the counter to reset the counter to zero, so as to achieve the effect of correcting the output pulse.

2 Claims, 1 Drawing Sheet

DIGITAL PULSE WIDTH MODULATION DEVICE

BACKGROUND OF THE INVENTION

1. Field of the invention

The present invention relates to a digital pulse width modulation device, more particularly to a pulse width modulation device having an actual output frequency of its output pulse duty determined by setting the total length of the pulse duty, and an actual output duty cycle ratio determined by setting the width of the pulse duty.

2. Description of Related Art

In general, pulse width modulation (PWM) control system is used for controlling an electronic device by the steps of detecting an output signal transmitted to a load to obtain a sensing signal, comparing the sensing signal with a reference signal, applying different duty cycles to a pulse depending on the result of comparison to obtain a pulse width modulation signal, and transmitting the pulse width modulation signal to the load to serve as a control signal. In other words, an appropriate width modulation of the pulse signal is generated by a negative feedback of the original output signal, and the width modulated pulse signal is used for controlling and outputting an appropriate output signal to the load.

In a conventional analog pulse width modulation control system, a sensing signal Vsense and a reference signal Vref are sent to a comparator, and a compare signal Vcmp is outputted, and then the output signal of the comparator is compared with a ramp signal Vramp by another comparator, and finally a constant frequency is outputted, wherein a pulse signal $V_{PWM}$ capable of changing the duty cycle is used for controlling the load.

However, the frequency of the ramp signal Vramp is unstable, and thus the control system may be interfered by noises easily. Although a resistor and a capacitor can be installed onto the comparator for frequency compensation, these external components incur additional cost.

SUMMARY OF THE INVENTION

In view of the shortcomings of the aforementioned conventional digital pulse width modulation device, the inventor of the present invention based on years of experience in the related industry to conduct extensive researches and experiments, and finally developed a digital pulse width modulation device in accordance with the present invention to overcome the shortcomings of the prior art.

Therefore, it is a primary objective of the present invention to provide a digital pulse width modulation device having an actual output frequency of the output pulse duty determined by setting the total length of the pulse duty and an actual output duty cycle ratio determined by setting the width of the pulse duty.

To achieve the foregoing objective, the present invention provides a digital pulse width modulation device comprising a counter, a first comparator and a second comparator, wherein the first and second comparators are connected in parallel with each other and in series with the counter. The counter is capable of sending a count signal to the first and second comparators simultaneously, starting a counting process when the counter receives a clock signal, and transmitting the count signal to the first and second comparators. If the first comparator receives a pulse duty width signal, the count of the count signal will generate a pulse output of the corresponding duty cycle. If the second comparator receives a total pulse duty length signal and the count of the count signal reaches a number of the total length, a clear signal will be outputted to the counter to reset the counter to zero, so as to achieve the effect of correcting the output pulse.

The technical characteristics and purposes of the present invention will become apparent with the detailed description of a preferred embodiment and the illustration of related drawings as follows.

DETAILED DESCRIPTION OF THE INVENTION

Figure 1:
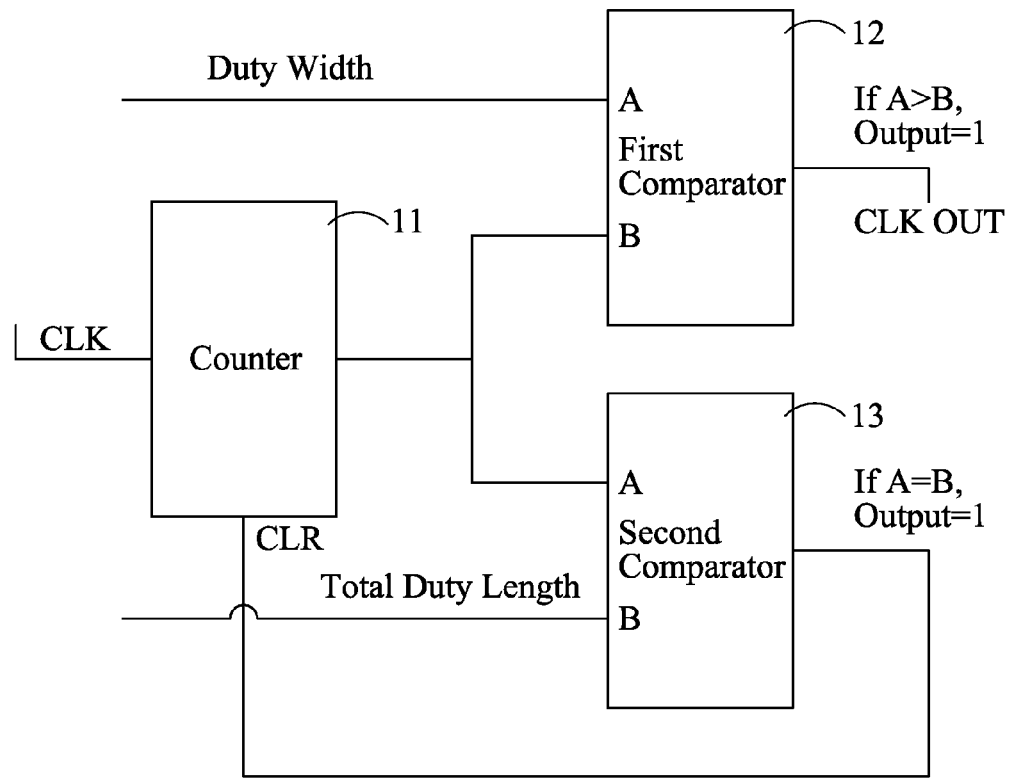
FIG. 1 is a circuit block diagram of a digital pulse width modulation device in accordance with the present invention.
Figure 2:
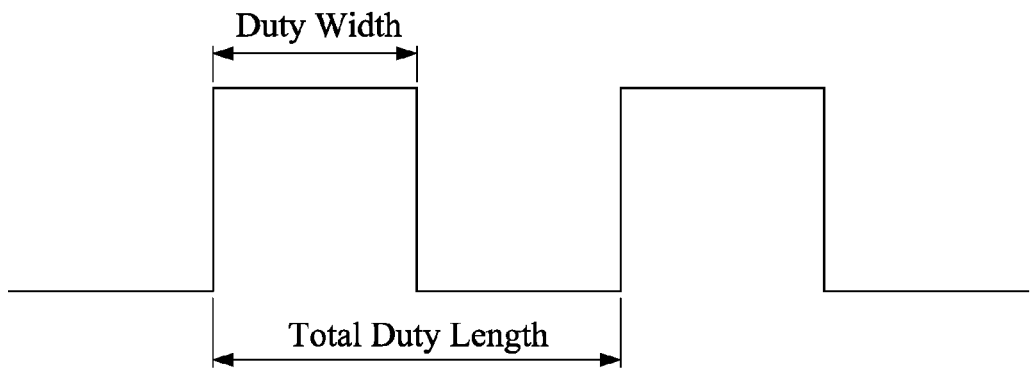
FIG. 2 is a waveform chart of a pulse generated by a digital pulse width modulation device in accordance with the present invention.

With reference to FIGS. 1 and 2 for a digital pulse width modulation device in accordance with the present invention, the digital pulse width modulation device comprises a counter 11, a first comparator 12 and a second comparator 13, wherein the first and second comparators 12, 13 are connected in parallel with each other and in series with the counter 11, such that the counter 11 can transmit a count signal to the first comparator 12 and the second comparator 13 simultaneously. If the counter 11 receives a clock (CLK) signal, the counter 11 will start counting and send the count signal to the first comparator 12 and the second comparator 13.

During use, if the first comparator 12 receives a pulse duty width signal the count of the count signal will generate a pulse output of the corresponding duty cycle (as shown in FIG. 2), and if the second comparator 13 receives a total pulse duty length signal and the count of the count signal reaches the number of the total length, a clear (CLR) signal will be sent to the counter 11, such that the counter 11 will reset to zero. Therefore, the actual output frequency can be determined by setting the total length of the pulse duty, and the actual output duty cycle ratio can be determined by setting the width of the pulse duty, so as to achieve the effect of correcting the pulse.

In FIGS. 1 and 2, after the counter 11 has received a rinsing edge (CLK) signal, the counter will be incremented by 1. The counter will reset to zero if the CLR signal is received. The first comparator 12 and the second comparator 13 are provided for controlling the width of the output duty and the total length of the duty respectively, and two formulae are obtained as follows:

Output Frequency=Input Frequency/Total Length of Duty

Duty Ratio=Width of Duty/Total Length of Duty (as shown in FIG. 2)

In FIG. 1, the counter 11 is a 74161 integrated circuit (IC).

Further, the digital pulse width modulation device of the present invention uses a frequency generated by the internal oscillation circuit as the basic frequency of the digital circuit, and the sample rate (including the total length and the width of the pulse duty) to determine the final output frequency (Basic Frequency/Sample Rate=Output Frequency), and the output duty cycle can be high or low according to the outputted sample rates adjusted according to different requirements, so as to achieve the effect of correcting the oscillation frequency and the width of output duty.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A digital pulse width modulation device, comprising a counter, a first comparator and a second comparator, characterized in that the first and second comparators are connected in parallel with each other and connected in series with the counter, such that the counter is capable of sending a count signal to the first and the second comparators simultaneously, starting a counting procedure when the counter receives a clock (CLK) signal, and transmitting the count signal to the first and second comparators, and if the first comparator receives a pulse duty width signal, the count of the count signal will generate a pulse output of the corresponding duty cycle, and if the second comparator receives a total pulse duty length signal and the count of the count signal reaches a number of the total length, a clear signal (CLR) will be outputted to the counter to reset the counter to zero, so as to achieve the effect of correcting pulse, wherein the first and the second comparators are provided for controlling width of the duty and total length of duty, respectively, and two formulas are obtained as follows:

output frequency =input frequency/the total length of duty, and duty ratio =the width of duty/the total length of duty, wherein the digital pulse width modulation device uses a frequency generated by an internal oscillation circuit as a basic frequency, and a sample rate including the total length and the width of the duty to determine a final output frequency by formula of the output frequency =basic frequency/sample rate, and output duty cycle can be high or low according the output sample rate adjusted according to different requirements, so as to achieve the effect of correcting oscillation frequency and the width of duty.

2. The digital pulse width modulation device of claim 1, wherein the counter is an integrated circuit.

* * * * *